(12) United States Patent
van de Vel et al.

(10) Patent No.: US 8,350,743 B2
(45) Date of Patent: Jan. 8, 2013

(54) AD CONVERTER

(75) Inventors: Hans van de Vel, Geel (BE); Berry Anthony Johannus Buter, Veldhoven (NL)

(73) Assignee: Integrated Device Technology, Inc, San Jose, CA (US)

( * ) Notice: Subject to any disclaimer, the term of this patent is extended or adjusted under 35 U.S.C. 154(b) by 91 days.

(21) Appl. No.: 13/085,748

(22) Filed: Apr. 13, 2011

(65) Prior Publication Data

US 2011/0254717 A1    Oct. 20, 2011

(30) Foreign Application Priority Data

Apr. 15, 2010 (EP) .................................... 10160085

(51) Int. Cl.
*H03M 1/12* (2006.01)
(52) U.S. Cl. ......................................... 341/172; 341/155
(58) Field of Classification Search .................. 341/172, 341/122, 118, 141, 126, 155, 120, 158, 166
See application file for complete search history.

(56) References Cited

U.S. PATENT DOCUMENTS 7,649,486 B2 * 1/2010 Toyomura et al. ............ 341/159

FOREIGN PATENT DOCUMENTS

WO    2008/142486 A1    11/2008

OTHER PUBLICATIONS

Yang, W. et al. "A 3-V 340-mW 14-b 75-Msample/s CMOS ADC With 85-dB SFDR at Nyquist Input", IEEE J. of Solid-State Circuits, vol. 36, No. 12, pp. 1931-1936 (Dec. 2001).
Lee, Z.-M. et al. "A CMOS 15-bit 125-MS/s Time-Interleaved ADC With Digital Background Calibration", IEEE J. Solid-State Circuits, vol. 42, No. 10, pp. 2149-2160, (Oct. 2007).
Vel van de, H. et al. "A 1.2-V 250-mW 14-b 100/MS/s Digitally Calibrated Pipeline ADC in 90-nm CMOS", IEEE J. Solid-State Circuits, vol. 44, No. 4, pp. 1047-1056 (Apr. 2009).
Extended European Search Report for European Patent Application No. 10160085.6 (Oct. 4, 2010).

* cited by examiner

*Primary Examiner* — Joseph Lauture
(74) *Attorney, Agent, or Firm* — Hayes & Boone

(57) ABSTRACT

Analog to digital conversion is performed by sampling an input voltage followed by AD conversion of the sampled voltage. In the sample and hold circuit a differential amplifier output voltage is generated between the first and second output of a differential amplifier in response to the sampled input voltage. A conversion polarity is selected by connecting the one output or the other of the differential amplifier to a circuit node in an AD conversion circuit using a first or second switch. These switches from both outputs of the differential amplifier to the same circuit node of the AD conversion circuit are both made conductive simultaneously prior to making the selected one of the first and second switch conductive. In this way, the amplifier output voltage is reset without requiring a dedicated switch just for this purpose.

8 Claims, 3 Drawing Sheets

AD CONVERTER

CROSS-REFERENCE TO RELATED APPLICATIONS

This application claims the priority under 35 U.S.C. §119 of European patent application no. 10160085.6, filed on Apr. 15, 2010, the contents of which are incorporated by reference herein.

FIELD OF THE INVENTION

The invention relates to an electronic circuit with a sample and hold circuit and an analog to digital converter.

BACKGROUND

Time discrete analog to digital conversion of a time dependent analog signal involves sampling of the analog signal by a sample and hold circuit at substantially discrete time points and processing of the sampled analog signals by an analog to digital converter to convert them to digital values.

Such a circuit may be optimized in various ways. High speed conversion may be realized by parallel conversion of samples for different time points. Because the time needed for conversion is longer than the minimal possible time between taking successive samples, this can be done by means of a demultiplexer between the sample and hold circuit and a plurality of analog to digital converters. Offset effects may be eliminated when using differential circuitry, among others by chopping the signal, i.e. conversion when the signal is applied with different polarity. Inter-sample interference may be eliminated by resetting voltages in the circuit between processing signals for different time points.

The application of chopping and demultiplexing to time discrete digital to analog conversion is described in an article by Zwei-Mei Lee et al., titled "A CMOS 15-bit 125-MS/s Time Interleaved ADC With Digital Background Calibration", published in the IEEE Journal of Solid State circuits, Vol 42, No 10, pages 2149-2160. This article discusses offset calibration of an analog to digital converter (ADC). A differential circuit is used, with a differential amplifier in the sample and hold circuit and ADCs with differential inputs. Switches connect the sample and hold circuit to alternate conversion channels.

A chopper switches the polarity of the connection between the differential amplifier and the differential input of a channel. Each output of the differential amplifier is coupled to each of the differential inputs via first and second switches of the chopper. The first and second switches are alternately made conductive, to reverse the polarity of the coupling from the amplifier to the ADC circuit. Zwei-Mei Lee et al. propose to do this in a pseudo random way during normal operation, to make it possible to determine an offset value from the ADC output, which can be used to correct for the offset. Zwei-Mei Lee et al. combine this with time interleaved conversion by different ADC circuits in parallel, connecting the differential amplifier of the sample and hold circuit alternatively to different ADC conversion pipelines.

In front of the digital output the circuit typically comprises one or more sampling capacitors to retain the analog voltage of the signal. The sample and hold circuit may comprise a differential amplifier to drive inputs of the analog to digital conversion circuits without affecting the sampled voltage on the sampling capacitors. An op amp may be used for example, which is activated in the hold phase of the sample and hold circuit, to copy charge from the sampling capacitors to further sampling capacitors of the conversion circuit.

Amplifier reset is described for example in an article by Wenhua Yang et al., titled "a 3-V 340 mW 14-b 75 Msample/s CMOS ADC With 85-dB SFDR at Nyquist Input", published in the IEEE Journal of Solid State Circuits, Vol. 36 No 12 pages 1931-1936. Amplifier reset reduces inter sample interference and it improves control of the amplifier's output voltages. Switches connected to the inputs and the outputs of the differential amplifier of the sample and hold circuit are provided, which are made conductive to reset voltages in the circuit. This enables more predictable settling time in the hold phase of operation, and usually faster settling as well, when the voltages start from standard mid values. However, the differential amplifier forms one of the main contributors to power consumption of the circuit, because if has to supply new charging current to its capacitive load at a high rate, for every new sampling time point. The load of the differential amplifier slows down operation.

SUMMARY

Among others, it is an object of the invention to speed up operation of an electronic circuit with an analog to digital converter.

An electronic circuit according to claim 1 is provided, comprising a sample and hold circuit, an analog to digital converter and switches that enable selectable ones of the outputs of a differential amplifier in the sample and hold circuit to be coupled to a circuit node of the analog to digital converter, for performing analog to digital conversion with selectable polarity. The circuit node may be an internal circuit node of the analog to digital converter or an input circuit node. A control circuit is provided that controls the switches to provide for a passive phase and a transfer phase in which the control circuit makes none and a selected one of the switches conductive respectively. In addition the control circuit provides for a short circuit phase wherein the control circuit makes both switches from the outputs of the differential amplifier to a same circuit node of the analog to digital conversion circuit conductive simultaneously. In this way a reset of the output of the differential amplifier is possible without requiring a large switch directly between the outputs of the differential amplifier.

In an embodiment wherein a plurality of analog to digital converters is used in parallel, outputs of the differential amplifier being connected with selected polarities to circuit nodes of alternate analog to digital converters, short circuit phases may be provided by making both switches from the outputs of the differential amplifier to the same circuit node of alternate ones of the analog to digital conversion circuit conductive simultaneously. By alternately using different switches to short circuit the outputs of the differential amplifier, a minimum disruption of analog to digital conversion is realized.

In an embodiment wherein an analog to digital converter with differential circuit nodes for receiving a differential signal is used, short circuits may be realized in the short circuit phase via both differential circuit nodes in parallel. In this way the maximum possible operation speed is raised.

In an embodiment wherein the sample and hold circuit comprises feedback switches coupled between the outputs of the differential amplifier and its inputs, the control circuit having outputs coupled to inputs of the feedback switches, the control circuit being configured to apply the short circuit phase while making the feedback switches non-conductive. Thus, inter sample interference is reduced.

In an embodiment no switch is provided that directly couples the first and second outputs of the differential amplifier. Thus, capacitive loading of the differential amplifier is minimized.

In an embodiment a method of performing analog to digital conversion is provided that comprises
sampling an input voltage;
generating a differential amplifier output voltage between the first and second output of a differential amplifier in response to the sampled input voltage;
selecting a conversion polarity;
making a first switch from the first output of the differential amplifier or a second switch from the second output of the differential amplifier to a circuit node of an analog to digital conversion circuit conductive dependent on the selected conversion polarity;
making both the first and second switch conductive simultaneously, prior to making the selected one of the first and second switch conductive.

In this way a short circuit current between the outputs of the differential amplifier can be realized using the switches that are provided for polarity reversal, without increasing capacitive load of the differential amplifier for the purpose of supporting this short circuit current.

BRIEF DESCRIPTION OF THE DRAWING

These and other objects and advantageous aspects will become apparent from a description of exemplary embodiments, using the following figures.

DETAILED DESCRIPTION OF EXEMPLARY EMBODIMENTS

Figure 1:
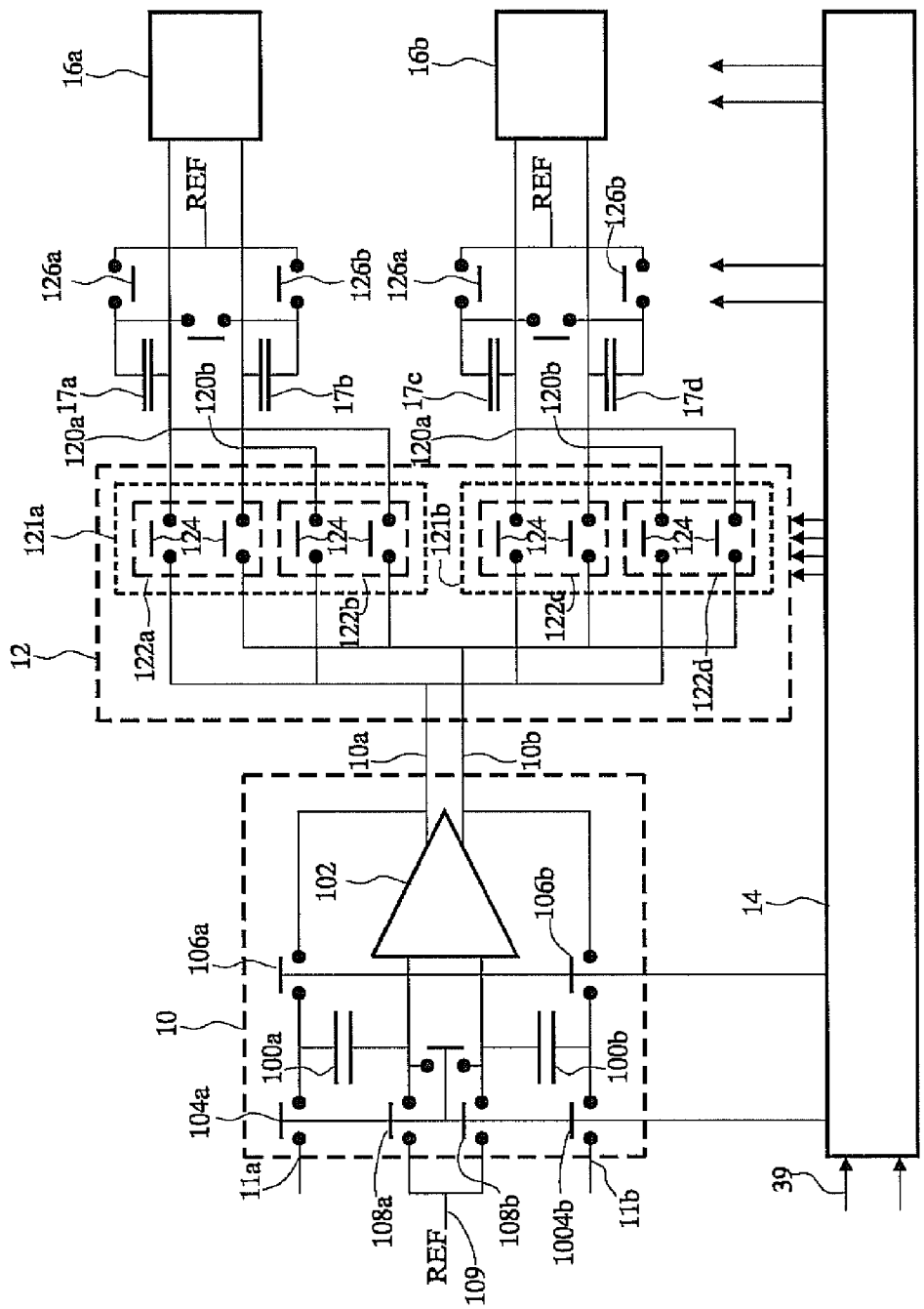
FIG. 1 shows a time discrete analog to digital conversion circuit

FIG. 1 shows a time discrete analog to digital conversion circuit, comprising a sample and hold circuit 10, a demultiplexing circuit 12, a control circuit 14, a first and second analog to digital conversion chain 16a,b and intermediate sampling capacitors 17a-d. Typically, demultiplexing circuit 12 and intermediate sampling capacitors 17a-d are part of an analog to digital conversion chain. The circuit may contain a plurality of such chains in parallel. Sample and hold circuit 10 has inputs 11a,b for receiving an input signal to be sampled and an output coupled to an input of demultiplexing circuit 12. First and second analog to digital conversion chain 16a,b have circuit nodes coupled to outputs of demultiplexing circuit 12. Intermediate sampling capacitors 17a-d are coupled from the connections between the analog to digital conversion chain 16a,b and demultiplexing circuit 12 to a reference terminal. Control circuit 14 has outputs coupled to control inputs of sample and hold circuit 10, demultiplexing circuit 12 and a first and second analog to digital conversion chain 16a,b.

In operation control circuit 14 controls sample and hold circuit 10 to sample signal voltages at inputs 11a,b and to transfer the sampled voltages to the output of sample and hold circuit 10. Switches in demultiplexing circuit 12 may function as input switches of the first stage of the analog to digital conversion chain and the intermediate sampling capacitors 17a-d are sampling capacitors of the first stage. Control circuit 14 controls demultiplexing circuit 12 to feed the output voltages alternatingly to circuit nodes of first and second analog to digital conversion chain 16a,b, with selectable polarity to realize chopping. First and second analog to digital conversion chains 16a,b convert the received signals to digital representations.

Figure 2:
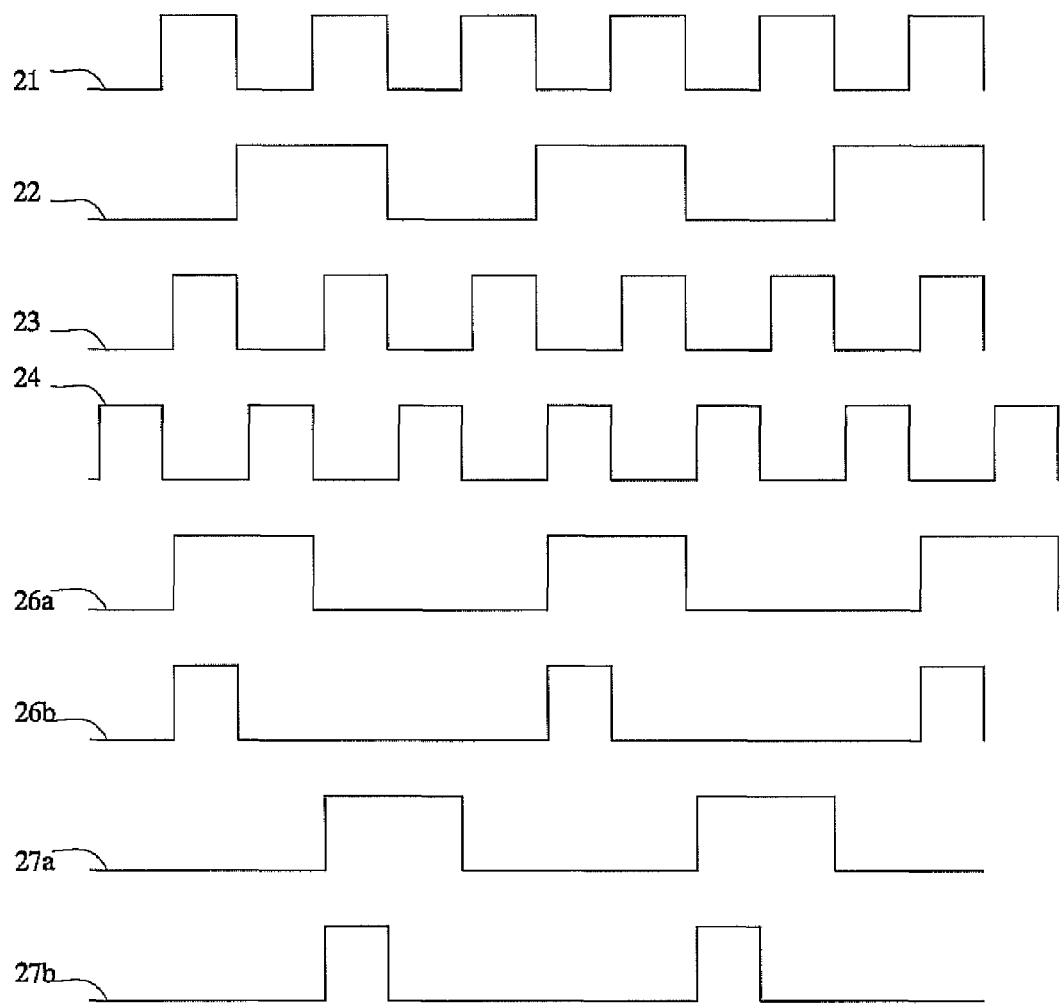
FIG. 2 shows a timing diagram of control signals

FIG. 2 shows a timing diagram of control signals from control circuit 14. A first trace 21 shows basic sampling clock timing, defining successive sampling periods wherein falling edges define the sampling time points. A second trace 22 defines alternation between first and second analog to digital conversion chain 16a,b.

FIG. 1 shows an embodiment of sample and hold circuit 10 wherein this circuit comprises a first and second sampling capacitor 100a,b, a differential amplifier 102, first and second input switches 104a,b, first and second feedback switches 106a,b and first and second reference switches 108a,b. Each of first and second sampling capacitor 100a,b has a first terminal and a second terminal. Control circuit 14 has outputs coupled to control inputs of input switches 104a,b, feedback switches 106a,b and reference switches 108a,b.

First and second input switch 104a,b are coupled between the first terminal of first and second sampling capacitor 100a,b and corresponding ones of the inputs 11a,b of the sample and hold circuit 10 respectively. First and second feedback switch 106a,b are coupled between the first terminal of first and second sampling capacitor 100a,b and corresponding ones of the outputs of differential amplifier 102 respectively. A negative feedback is realized, differential amplifier 102 having negative gain from the ones of its inputs and outputs that are coupled via a sampling capacitor 100a,b and a feedback switch 106a,b. First and second reference switches 108a,b are coupled between the second terminal of first and second sampling capacitor 100a,b and a reference node 109. In addition, an optional further switch coupled directly between the second terminals of first and second sampling capacitor 100a,b and controlled by control circuit 14 may be provided.

In operation sample and hold circuit 10 operates alternately in a first and second phase. In the first phase the first terminals of sampling capacitors 100a,b are conductively connected to inputs 11a by input switches 104a,b and the second terminals are conductively connected to reference node 109 by reference switches 108a,b. Feedback switches 106a,b are made non-conductive. Thus, sampling capacitors 100a,b are charged dependent on the input signal. The switches may be implemented using conduction channels of transistors, with a control electrode of the transistor as a switch control input. As will be appreciated, in this context conductive and non-conductive refer to the degree of conductivity realized by such switching transistors.

In the second phase the first terminals of sampling capacitors 100a,b are conductively connected to the outputs of differential amplifier 102 by feedback switches 106a,b. Reference switches 108a,b and input switches 104a,b are made non conductive. As a result, in the second phase the voltages at the second terminals equal the voltages at the output nodes of the differential amplifier 102 plus the voltages across sampling capacitors 100a,b, due to earlier charging by the input signal in the first phase. Differential amplifier 102 functions as an op amp that tends to make its differential input voltage zero, so that the voltage difference between its output nodes must equal the differences between the voltages across sampling capacitors 100a,b.

FIG. 2 shows the timing of control signals 23, 24 for input switches 104a,b, and feedback switches 106a,b. A break before make relation is realized between input switches 104a,b and feedback switches 106a,b. Reference switches 108a,b are controlled substantially in phase with input switches 104a,b, but they are preferably made non-conductive with a small lead time interval before input switches 104a,b. Herein "small" means smaller than the duration between break and make input switches 104a,b and feedback switches 106a,b.

FIG. 1 shows an embodiment of demultiplexing circuit 12 coupled to a plurality of pairs of circuit nodes 120a,b at the output of demultiplexing circuit 12, each pair of circuit nodes 120a,b connected to a respective one of the analog to digital conversion chains 16a,b. Pairs of intermediate sampling capacitors 17a,b, 17c,d are provided each intermediate sampling capacitor 17a-d with a first terminal coupled to a respective one of the circuit nodes 120a,b. Each pair of intermediate sampling capacitors 17a,b serves retain a sample voltage for a respective one of the analog to digital conversion chains 16a,b.

Demultiplexing circuit 12 comprises a plurality of groups 121a,b of switches 124, each for a respective one of the analog to digital conversion chains 16a,b. Each group 121a,b of switches comprises a first and second pair 122a,b, 122c,d of switches 124. The switches 124 of the first pair 122a in the first group 121a are coupled between the outputs of sample and hold circuit 10 and a first and second circuit node 120a,b of demultiplexing circuit 12 for the first analog to digital conversion chain 16a. The switches 124 of the second pair 122b of the first group 121a are coupled between the outputs of sample and hold circuit 10 and the second and first circuit node 120a,b of demultiplexing circuit 12 for the first analog to digital conversion chain 16a, crosswise compared to the switches 124 of the first pair 122a. Similar switch connections are provided in the second group 121b, to the second analog to digital conversion chain 16b.

Control circuit 14 has outputs coupled to control inputs of the switches 124 in the groups 121a,b of pairs 122a-d. Furthermore reference switches 126a,b are provided, coupling second terminals of the intermediate sampling capacitors 17a-d to a reference node. Further switches may be provided, coupled between the second terminals of the intermediate sampling capacitors 17a,b for the same analog to digital conversion chain 16a,b.

In operation the groups 121a,b of pairs 122a-d of switches 124 perform a number of functions. A first function involves providing connections in an alternating way to the first and second analog to digital conversion chains 16a,b and the intermediate sampling capacitors 17a-d at their inputs, by alternately activating switches in the first and second group 121a,b. A second function involves inverting the polarity of these connections to realize chopping, by activating either the switches of the first pair 122a, 122c or the second pair 122b, 122d of the group 121a,b. A third function involves a short circuit phase wherein switches to a same circuit node 120a,b from different pairs 122a,b, 122c,d in a same group 121a,d are made conductive simultaneously, so that in the short circuit phase the outputs of sample and hold circuit 10 are short circuited via a pair of circuit nodes 120a,b of de-multiplexing circuit 12.

FIG. 2 shows timing of control signals 26a,b from control circuit 14 for a group 121a of pairs 122a,b of switches 124 coupled to circuit nodes 120a,b to the first analog to digital conversion chains 16a,b and intermediate sampling capacitors 17a,b. A short circuit phase, a transfer phase and a passive phase can be distinguished. In the short circuit phase, the control signals 26a,b are provided to make both pairs 122a,b in the group 121a conductive (control signals for both pairs 122a,b in the group 121a both high). In the transfer phase only one of the pairs 122a,b of the switches 124 in the group is made conductive, so that each sample and hold circuit 10 output is coupled to a different output node 10a,b of demultiplexing circuit 12. Dependent on the desired polarity either the first pair 122a is made conductive and the second pair 122b is made non-conductive or the second pair 122b is made conductive and the first pair 122a is made non-conductive. In the passive phase both pairs 122a,b of switches 124 of the group 121a. are made non-conductive.

Control signals 27a,b similar to the control signals 26a,b for the first group 121a are provided for the second group 121b, except that they are shifted in phase, so that the short circuit phase and the transfer phase of the second group occur during the passive phase of the first group and vice versa.

As can be seen control circuit 14 provides for successions of a short circuit phase and a normal operation phase, by providing for a high control signal for a pair 122a of switches 124 of a group 121a during both the short circuit phase and the transfer phase and a high control signal for the other pair 122b of switches 124 of the group 121a only during the short circuit phase. Control circuit 14 makes the short circuit phase coincide with the operation phase of sample and hold circuit 10 wherein input switches 104a,b are conductive, and feedback switches 106a,b are non-conductive. Thus, the amplifier output voltages are equalized.

When a reverse polarity connection between sample and hold circuit 10 and the circuit nodes 120a,b of demultiplexing circuit 12 for an analog to digital conversion chain is required, the roles of the pairs of switches in the group are exchanged. The pair of switches that was made conductive only in the short circuit phase for normal polarity is made conductive during both the short circuit phase and the transfer phase, and the other pair of switches, which was made conductive during both the short circuit phase and the transfer phase for normal polarity, is made conductive only in the short circuit phase.

Control circuit 14 makes the transfer phase last during the phase wherein feedback switches 106a,b of sample and hold circuit are conductive. Thus, differential amplifier 102 charges intermediate sampling capacitors 17a,b in this phase. Control circuit 14 makes reference switches 126a,b conductive substantially during the succession of the short circuit phase and the transfer phase. Preferably control circuit 14 makes reference switches 126a,b non-conductive in advance of the succession by a small lead time interval, similar to the small lead time interval of the reference switches in sample and hold circuit 10.

Control circuit 14 alternates successions of a short circuit phase and a transfer phase for the circuit nodes 120a to the first and second analog to digital conversion chains 16a,b. In this way, voltages in the other chain are not disturbed.

Preferably, no switch is provided coupled directly between the outputs of differential amplifier 102. When the outputs are short circuited, this is always done via at least one circuit node 120a,b through switches 124 to those output nodes. Thus, the capacitive load of the outputs of the differential amplifier is kept at a minimum, which improves maximum possible circuit speed. In another embodiment a small additional switch may be used between the output, for example to help the short circuit, the switches 124 taking care of at least half of the short circuit current via circuit nodes 120a,b. Because the additional switch can be kept small, this also allows for improved maximum possible output speed.

Figure 3:
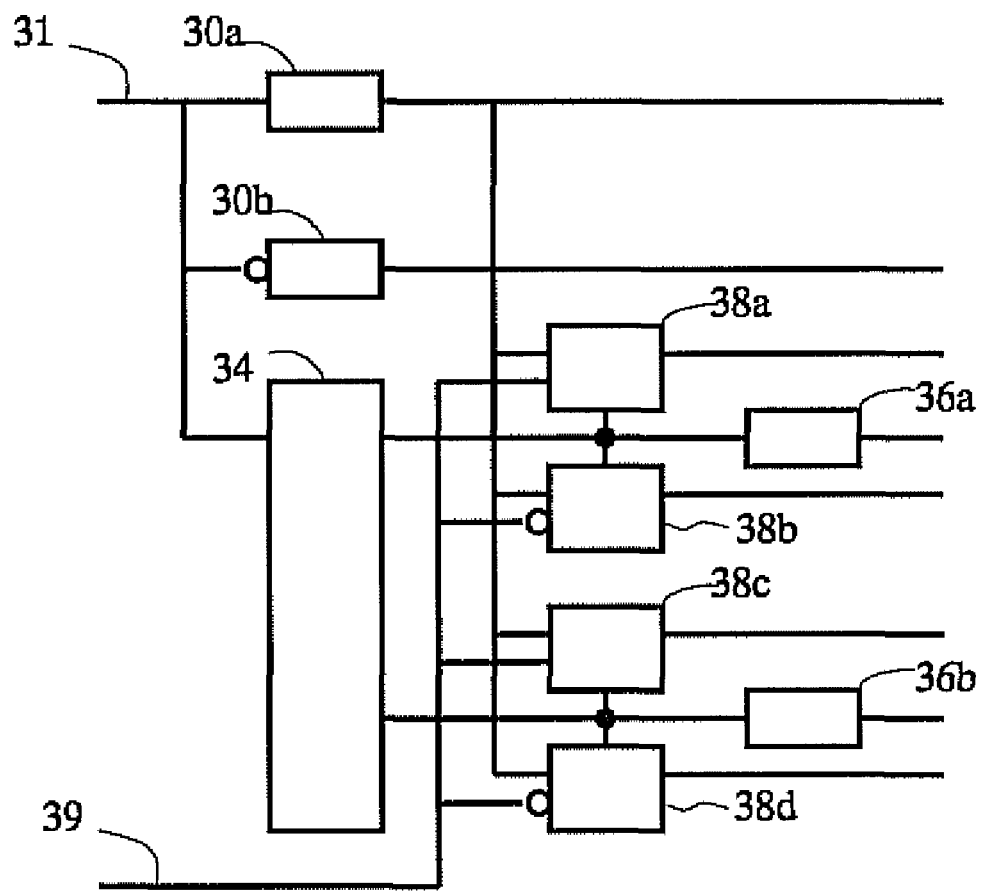
FIG. 3 shows a control circuit

FIG. 3 shows an embodiment of control circuit 14, comprising a first and second pulse shaping circuit 30a,b, a divider 34, third and fourth pulse shaping circuits 36a,b and AND gates 38a-d. Control circuit 14 has a clock input 31 and a polarity selection input 39. Clock input 31 is coupled to divider 34 and to first and second pulse shaping circuit 30a,b, the latter after inversion. First pulse shaping circuit 30a has an output coupled to control inputs of input switches 104a,b (not shown) and reference switches 108a,b (not shown), the former via an optional delay circuit. Second pulse shaping circuit 30b has an output coupled to control inputs of feedback switches 106a,b (not shown). Pulse shaping circuits 30a,b are designed to provide for break before make behavior. A pulse shaping circuit may comprise an AND gate for example with one input coupled directly to the input of the pulse shaping circuits 30a and the other via a delay circuit, the output of the AND gate forming the output of the pulse shaping circuit.

Divider 34 has opposite phase outputs coupled to control inputs of pairs of switches in different groups in demultiplexing circuit 12 via AND gates 38a-d. Each divider output is coupled to a first input of a first and second one of the AND gates 38a-d, which have outputs coupled to the control inputs of the switches 124 of the pairs 122a-d of switches in the groups 121a,d. Second inputs of AND gates 38a-d are coupled to polarity selection input 39, AND gates 38a-d for pairs of switches in the same group receiving polarity selection signals of mutually opposite logic level. The outputs of AND gates 38a-d are coupled to control inputs pairs of switches in of the groups of switches. Control circuit 10 may comprise further circuits (not shown) to generate control signals for analog to digital conversion chains 16a,b (not shown).

In operation this embodiment control circuit 14 realizes the control signals shown in FIG. 2. However, it should be realized that many different embodiments can be used to realize similar signals.

Although an embodiment with two analog to digital conversion chains 16a,b has been described, it should be appreciated that more chains may be used in parallel. Thus more time is made available for analog to digital conversion. In this case control circuit may be configured to provide successions of a short circuit phase and a transfer phase successively for each different analog to digital conversion chain in a cyclical manner. In an embodiment a single analog to digital conversion chain may be used, in which case demultiplexing circuit 12 need only provide for polarity reversal and not for switching to different chains. In this case the same group of pairs of switches is always made conductive in the short circuit phase. However, in this case the multiplexed output sample rate is limited to the conversion speed of the analog to digital conversion chain.

Although an embodiment has been described wherein the analog to digital conversion chains 16a,b have differential inputs, alternatively analog to digital conversion chains 16a,b with single ended inputs may be used. In this case the pairs 122a-d of switches 124 may each be replaced by a single switch 124, so that each group 121a,d comprises switches from the single ended input of an analog to digital conversion chain 16a,b to both outputs of differential amplifier 102.

In this embodiment, a short circuit between the outputs of the differential amplifier 102 is realized by the single switches in the group. In another embodiment, a similar short circuit may be applied also when the analog to digital conversion chains 16a,b have differential inputs. In this embodiment, only one of the switches 124 of each pair 122a-d of a group 121a,b needs to be made conductive in the short circuit phase, the other being made non-conductive, selecting the switches so that switches 124 to a same input of the corresponding analog to digital conversion chains 16a are made conductive simultaneously.

However, the simultaneous conductivity of both switches in each pair of a group in the short circuit phase has the advantage that the charges on intermediate sampling capacitors are also equalized in the short circuit phase, which reduces the risk of inter sample interference without requiring additional switches.

Although one possible embodiment of sample and hold circuit has been shown by way of example, it should be appreciated that other sample and hold circuits could be used. For example, a charge redistribution circuit as disclosed in FIG. 2a of the article by Wenhua Yang may be used. Herein the sample and hold circuits has two series arrangements of capacitors, with interior nodes between the capacitors in the series arrangements coupled to the inputs of a differential amplifier. In the charge redistribution circuit the differential amplifier has feedback switches coupled from its output to the series arrangements and a control circuit to make the feedback switches in a hold phase. In the hold phase the differential amplifier drives the voltage at the intermediate sampling capacitors in parallel with the voltage across the series arrangements, to equalize the voltages at the interior nodes. In this embodiment a multiplexing circuit like demultiplexing circuit 12 may be used to provide for switching between connections to different conversion circuits, polarity reversal for chopping, and short circuiting the amplifier outputs in a time interval wherein the feedback switches are non-conductive.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An electronic circuit comprising
a sample and hold circuit having a differential amplifier with a first and a second output for a differential amplifier output voltage between the first and second output;
an analog to digital converter;
a first and a second switch coupled between a circuit node of the analog to digital converter and the first and second outputs of the differential amplifier respectively,
a control circuit having outputs coupled to control inputs of the first and second switches, the control circuit being configured to generate control signals at the control inputs of the first and second switches that define a short circuit phase, a transfer phase and a passive phase, making the first and second switches simultaneously conductive in the short circuit phase, making a selectable one of the first and second switches conductive and the other non-conductive in the transfer phase and making both the first and second switches non-conductive in the passive phase.

2. An electronic circuit according to claim 1, further comprising a further analog to digital converter, a third and a fourth switch coupled between a circuit node of the further analog to digital converter and the first and second outputs of the amplifier respectively, the control circuit being configured to generate control signals at control inputs of the third and fourth switches alternately defining a first succession of a short circuit phase and a transfer phase for the first and second switches while applying a passive phase to the third and fourth switches and a second succession of a short circuit phase and a transfer phase for the third and fourth switches while applying a passive phase to the first and second switches.

3. An electronic circuit according to claim 1, wherein the analog to digital converter has differential circuit nodes, including said circuit node and a further circuit node for receiving a differential signal between the circuit node and the further circuit node, the electronic circuit having a first group of switches, including a first and a second pair of switches, the first and second pairs including said first and second switches respectively, and a further first and second switches coupled between the further circuit node of the analog to digital converter and the second and first outputs of the differential amplifier respectively, the control circuit being configured to make the switches in the first pair conductive and non conductive together and to make the switches in the second pair conductive and non conductive together.

4. An electronic circuit according to claim 1, wherein the sample and hold circuit includes feedback switches coupled between the outputs of the differential amplifier and its inputs, the control circuit having outputs coupled to inputs of the feedback switches, the control circuit being configured to apply the short circuit phase while making the feedback switches non-conductive.

5. An electronic circuit according to claim 1, wherein no switch is directly connected from the first output of the differential amplifier to the second outputs of the differential amplifier.

6. A method of performing analog to digital conversion comprising
sampling an input voltage;
generating a differential amplifier output voltage between a first and a second output of a differential amplifier in response to the sampled input voltage;
selecting a conversion polarity;
making a first switch from the first output of the differential amplifier or a second switch from the second output of the differential amplifier to a circuit node of an analog to digital conversion circuit conductive dependent on the selected conversion polarity; and
making both the first and second switches conductive simultaneously, prior to making the selected one of the first and second switches conductive.

7. A method according to claim 6, further comprising making selected ones of the first and second switches between circuit nodes of a first and a second analog to digital conversion circuit and the first and second outputs of the differential amplifier conductive, alternately for the first and second analog to digital conversion circuits and, when making the selected one of the first and second switches to the circuit node conductive making of the first or second analog to digital conversion circuits conductive, making both the first and second switches to the circuit node conductive before making the selected one of the first and second switches to that circuit node conductive.

8. A method according to claim 6, wherein, when the first and output of the differential amplifier are short circuited to each other, they are always short circuited entirely via one or more switches to one or more circuit nodes of the analog to digital conversion circuit, or one or more circuit nodes of one or more other analog to digital conversion circuits that are operated in parallel to the analog to digital conversion circuit.

* * * * *